United States Patent [19]

Kadohashi

[11] 4,308,482
[45] Dec. 29, 1981

[54] PIEZOELECTRIC DEVICE UTILIZING AN ELECTROCONDUCTIVE PLIABLE SHEET UNDER PRESSURE

[75] Inventor: Ititoshi Kadohashi, Hakui, Japan

[73] Assignee: Murata Manufacturing Co., Ltd., Japan

[21] Appl. No.: 41,900

[22] Filed: May 23, 1979

[30] Foreign Application Priority Data

Jul. 28, 1978 [JP] Japan .................................. 53-92863

[51] Int. Cl.³ ............................................ H01L 41/08
[52] U.S. Cl. .................................... 310/354; 310/345; 310/363
[58] Field of Search ................ 310/342, 345, 354–356, 310/363, 364, 327; 333/186, 197, 199

[56] References Cited

U.S. PATENT DOCUMENTS

| 1,886,814 | 11/1932 | Hund | 310/354 X |
| 3,109,153 | 10/1963 | Rodek | 310/354 X |

FOREIGN PATENT DOCUMENTS

| 151750 | 6/1953 | Australia | 310/342 |
| 44-16683 | of 1969 | Japan | 333/199 |
| 44-23196 | of 1969 | Japan | 310/363 |

Primary Examiner—Mark O. Budd

[57] ABSTRACT

A piezoelectric filter comprises at least one piezoelectric resonator comprising a piezoelectric substrate and first and second electroconductive terminal members deposed one on each side of the piezoelectric substrate, with which they are in electrical contact. At least one electroconductive pliable sheet is disposed between the first terminal member and the associated face of the piezoelectric substrate, and pressure is applied across the thickness of the combination of electrodes, pliable sheet and substrate.

4 Claims, 11 Drawing Figures

Fig. 1 Prior Art
Fig. 2 Prior Art
Fig. 3
Fig. 4
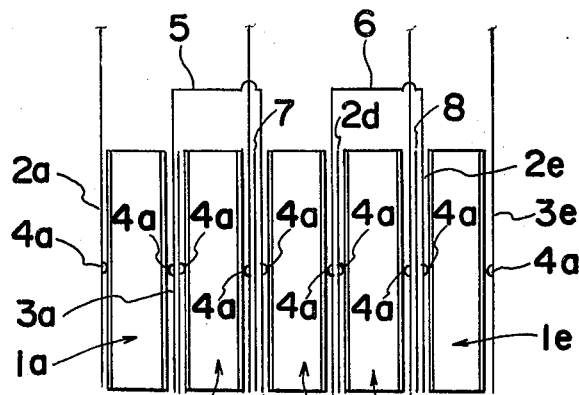
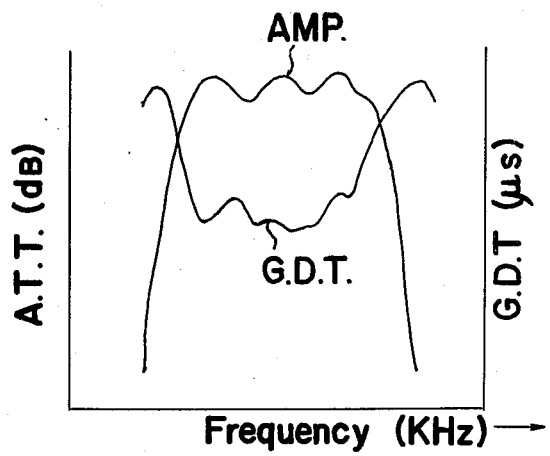
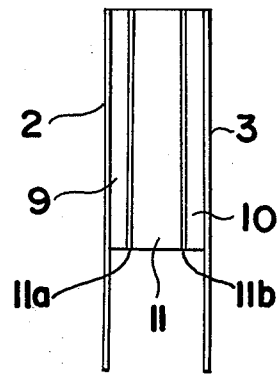
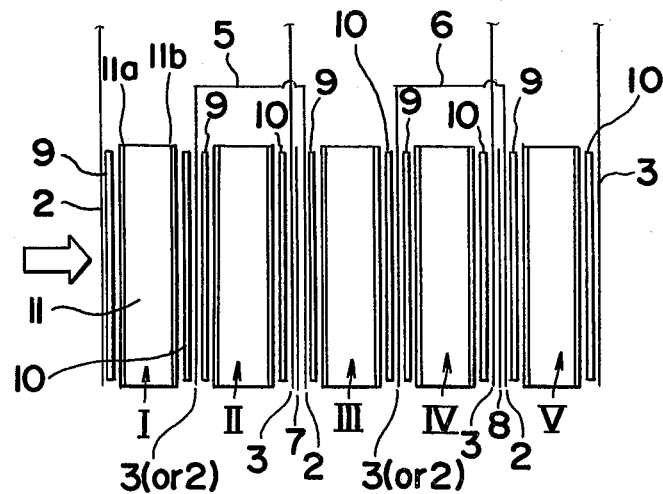

PIEZOELECTRIC DEVICE UTILIZING AN ELECTROCONDUCTIVE PLIABLE SHEET UNDER PRESSURE

BACKGROUND OF THE INVENTION

The present invention relates to a piezoelectric filter having an improved group delay time characteristic (hereinafter referred to as the G.D.T. characteristic).

There has heretofore been known a ladder type filter constituted by a plurality of piezoelectric resonators each utilizing a face vibration mode or a radial vibration mode, an example of which is shown in FIG. 1 of the accompanying drawings in side elevational view. Referring to FIG. 1, the prior art ladder type filter comprises a plurality of, for example, five, piezoelectric resonators 1a, 1b, 1c, 1d and 1e. Of these piezoelectric resonators, the piezoelectric resonators 1a, 1c and 1e are series resonance elements while the piezoelectric resonators 1b and 1d are parallel resonance elements, these piezoelectric resonators being so arranged that a parallel resonance element is positioned between each two adjacent series resonance elements. These piezoelectric resonators 1a to 1e are of identical construction and each piezoelectric resonator 1a, 1b, 1c, 1d and 1e includes a piezoelectric substrate of a plate-like configuration of any desired shape, for example, a square shape, having its opposing major surfaces coated or deposited with electrode layers of known fabrication, and first and second electroconductive terminal plates 2a and 3a, 2b and 3b, 2c and 3c, 2d and 3d, or 2e and 3e. Each of these first and second terminal plates contacts and is, therefore, electrically connected to a corresponding face of the piezoelectric substrate through an electroconductive protuberance 4a rigidly secured to or integrally formed with the terminal plates, the point of contact of the protuberance 4a with the corresponding face of the piezoelectric substrate of the associated resonator corresponding to a node of vibration of that piezoelectric substrate. The protuberances 4a are kept at a certain position and are urged against the corresponding face of the piezoelectric substrate of the associated resonator by application of a small pressure, such as 250~300 g/cm$^2$ by means of a spring having a known construction. While the terminal plates 2a and 3e serve as input and output terminal elements, respectively, the terminal plates 3a and 2c are electrically connected to each other by means of a bridge element 5 and the terminal plates 3c and 2e are electrically connected to each other by means of a bridge element 6. Electrically insulating sheets 7 and 8 are positioned respectively between the terminal plates 3b and 2c and between the terminal plates 3d and 2e. In use, the terminal plates 3b and 3d are electrically grounded.

The selective filtering characteristic and the G.D.T. characteristic of the prior art ladder type filter are shown in a graph of FIG. 2. An improvement of such a ladder type filter as described above has long been desired to improve the G.D.T. characteristic in order to suppress the phase distortion. One conventional method for improving the G.D.T. characteristic is to decrease the mechanical quality factor Q to a value of from several tens to hundreds. However, it has been found that the conventional method for improving the G.D.T. characteristic entails various difficulties. In particular, depending upon the particular value of the mechanical quality factor Q chosen, the ratio of materials to be mixed together has to be adjusted and, consequently, the filter having a desired temperature characteristic TC, electromechanical coupling coefficient K and dielectric constant can no longer be obtained without difficulty.

Moreover, as the mechanical quality factor Q is lowered, the frequency constant (Fol) is correspondingly reduced. By way of example, when a filter utilizing resonators having a relatively low mechanical quality factor Q is incorporated in a casing in which resonators having a mechanical quality factor Q of about 1,000 are incorporated, the resistance to impact tends to be intolerably low, and the attenuation level varies considerably, because the resonators employed are small in size.

SUMMARY OF THE INVENTION

Accordingly, the present invention has been made with a view to substantially eliminating the above described disadvantages and inconveniences inherent in the prior art piezoelectric filter, and has for its essential object to provide an improved piezoelectric filter having an improved G.D.T. characteristic and comprising at least one piezoelectric resonator with a relatively high mechanical quality factor Q.

Another important object of the present invention is to provide an improved piezoelectric filter of the type referred to above, wherein the piezoelectric resonator is of a construction having a relatively high resistance to vibration and impact and is supported in an electrically and mechanically stable manner.

A further object of the present invention is to provide an improved piezoelectric filter of the type referred to above utilizing conventional component parts to improve the G.D.T. characteristic.

A still further object of the present invention is to provide an improved piezoelectric filter of the type referred to above that can be manufactured simply and without any increase in manufacturing cost.

For accomplishing these and other objects of the present invention, there is provided a piezoelectric filter comprising at least one piezolectric resonator including a piezoelectric substrate and first and second electroconductive terminal members disposed on and in electrical contact with the first and second major opposing sides of the piezoelectric substrate respectively. At least one electroconductive pliable sheet is positioned between the first electroconductive terminal member and the associated face of the piezoelectric substrate.

According to the present invention, unlike each of the terminal plates employed in the prior art filter of the construction shown in FIG. 1, the terminal members employed in the present invention have no protuberances and are instead held flat against the corresponding face of the piezoelectric substrate or against the interposed electroconductive pliable sheet.

In the assembled condition and in use, the filter according to the present invention is subjected to pressure applied in a direction perpendicular to any one of the opposed major faces of the piezoelectric substrate so that the G.D.T. characteristic can be improved.

The electroconductive pliable sheet employed in the present invention is currently commercially available in three types. The first of them is an electroconductive plastic sheet having electroconductivity in all directions; the second type is an electroconductive plastic sheet having substantial electroconductivity only across its thickness; the third is an electroconductive plastic sheet having substantial electroconductivity only across its thickness and only when external pressure is applied. The second type of the direction-oriented electroconductive plastic sheet is generally made of a sheet of silicone rubber containing electroconductive material, for example, metallic particles, carbon particles or metallic fibers, dispersed therein in a predetermined arrangement. The second type is similar in character to the third type, but differs from the latter in that the third type requires the application of the pressure to establish the electroconductivity. The last two types are a fairly recent development and are generally termed "anisotropically electroconductive plastic sheet" and "pressure-conductive sheet" by those skilled in the art, respectively. In view of these recently developed electroconductive plastic sheets, the term "total-conductive plastic sheet" is employed herein to denote the first-mentioned type and also to render the first mentioned type distinct from either the second or the third type.

In any event, not only the total-conductive plastic sheet, but also either the anisotropically electroconductive plastic sheet or the pressure-conductive plastic sheet can be utilized in the present invention.

BRIEF DESCRIPTION OF THE DRAWINGS

These and other objects and features of the present invention will become apparent from the following description of a preferred embodiment thereof with reference to the accompanying drawings, in which:

FIG. 1 is a side elevational view of the prior art ladder-type filter, reference to which has already been made;

FIG. 2 is a graph showing the A.M.P. and G.D.T. characteristics of the prior art filter shown in FIG. 1;

FIG. 3 is a side elevational view of a piezoelectric resonator forming a part of a filter according to the present invention;

FIG. 4 is a side elevational view, showing the details of the internal structure of a ladder-type filter according to the present invention;

DETAILED DESCRIPTION OF THE INVENTION

Figure 5:
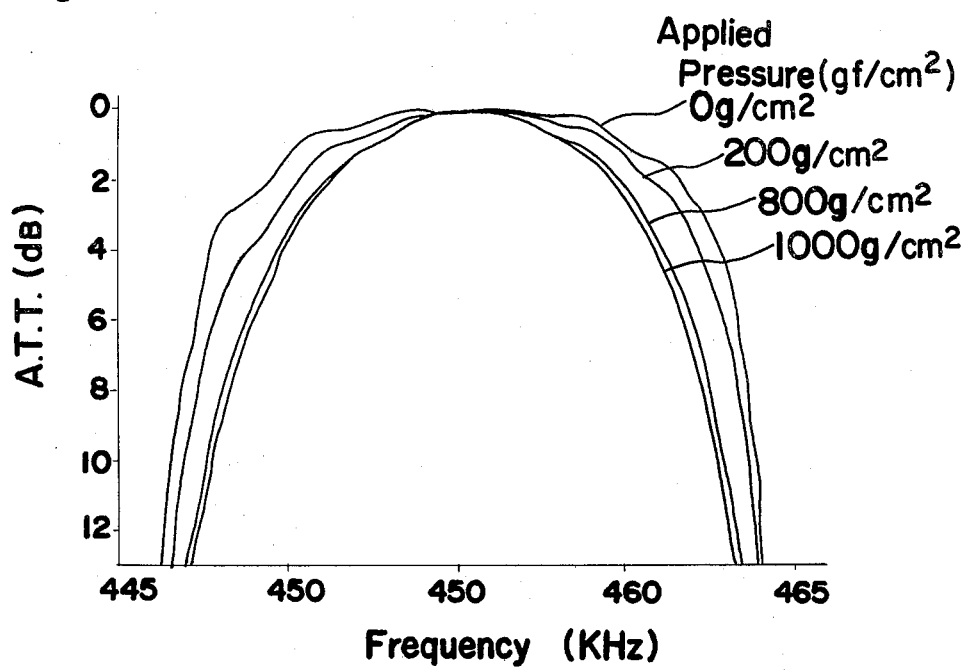
FIG. 5 is a graph showing the relationship between variation in pressure applied to the resonator and variation in band width of the filter of the present invention.

Before the description of the present invention proceeds, it is to be noted that like parts are designated by like reference numerals throughout the accompanying drawings.

Referring first to FIG. 3, there is shown a piezoelectric resonator forming a part of a filter according to the present invention. The piezoelectric resonator comprises a piezoelectric substrate 11 of a plate-like configuration having, for example, a square shape and having its opposing major surfaces coated or deposited with electrode layers 11a, 11b of known construction in association with first and second electroconductive terminal plates 2 and 3, the first terminal plate 2 facing one of the major faces of the piezoelectric substrate 11 and the second terminal plate 3 facing its other major face. These first and second terminal plates 2 and 3 are electrically connected to the piezoelectric substrate 11 through respective electroconductive pliable sheets 9 and 10.

Where the ladder-type filter is desired, a plurality of, for example, five, piezoelectric resonators each being of the construction which has been described with reference to and shown in FIG. 3, are assembled in the manner shown in FIG. 4. In FIG. 4, the five piezoelectric resonators are respectively identified by I, II, III, IV and V and are arranged in face-to-face relation to each other in a manner substantially similar to that shown in FIG. 1.

However, because the terminal plates 2 and 3 are not provided with such electroconductive protuberances as are required in the prior art arrangement shown in FIG. 1, either the second terminal plate 3 of either the first or the third resonators I and III or the first terminal plate 2 of either the second or the fourth resonators II and IV can be omitted, as shown.

As is the case with the filter shown in FIG. 1, the first terminal plate 2 of the first resonator I and the second terminal plate 3 of the fifth resonator V respectively serve as input and output terminal elements, while the second terminal plate 3 of the second resonator II and the second terminal plate 3 of the fourth resonator IV are adapted to be electrically grounded.

In practice, the assembly shown in FIG. 4 is housed in a casing and is subjected to a relatively great pressure, for instance, 600 gf/cm$^2$, so as to compress the resonators I to V together. This pressure may be exerted by one or more spring elements positioned between a wall of the casing and either the first terminal plate 2 of the first resonator I or the second terminal plate 3 of the fifth resonator V.

Figure 6:
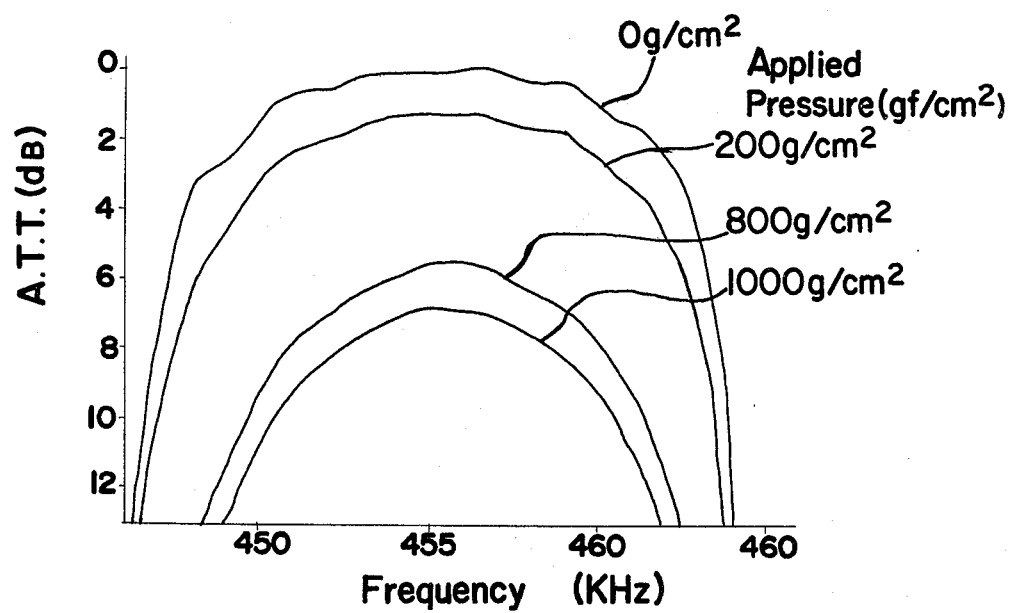
FIG. 6 is a graph showing the relationship between variation in pressure applied to the resonator and the insertion loss of the filter of the present invention.
Figure 7:
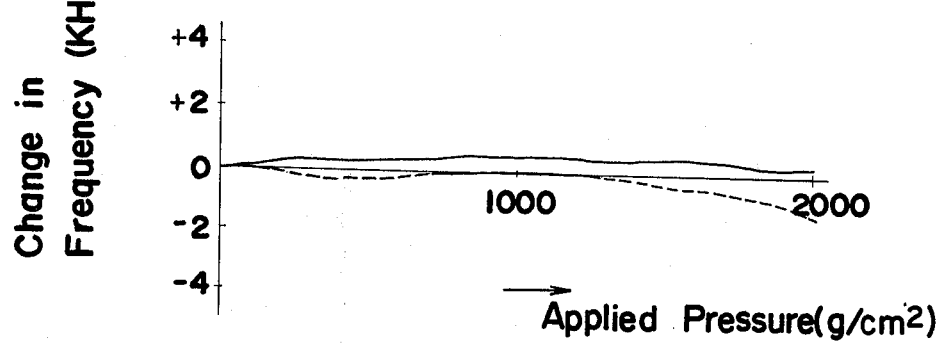
FIG. 7 is a graph showing the relationship between variation in applied pressure and the resonance frequency of the filter of the present invention.
Figure 8:
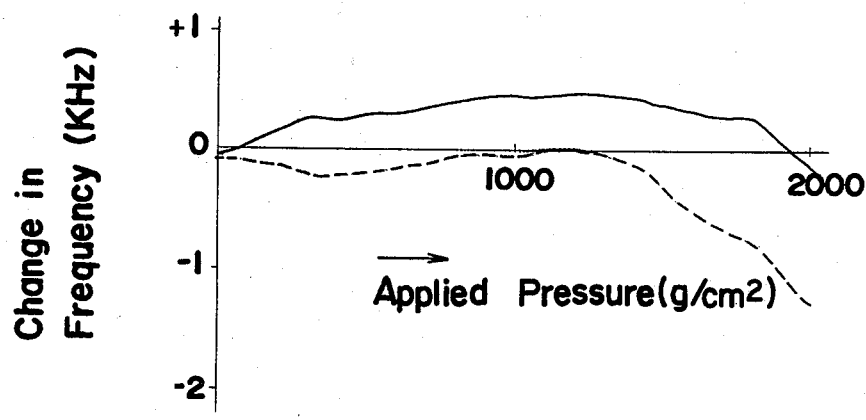
FIG. 8 is a graph showing the relationship between variation in applied pressure and the antiresonance frequency of the filter of the present invention.
Figure 9:
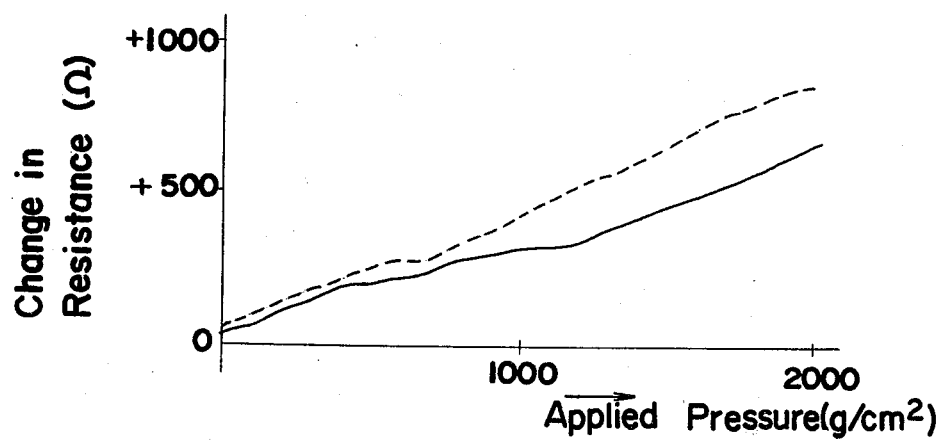
FIG. 9 is a graph showing the relationship between variation in applied pressure and the resonant resistance of the filter of the present invention.
Figure 10:
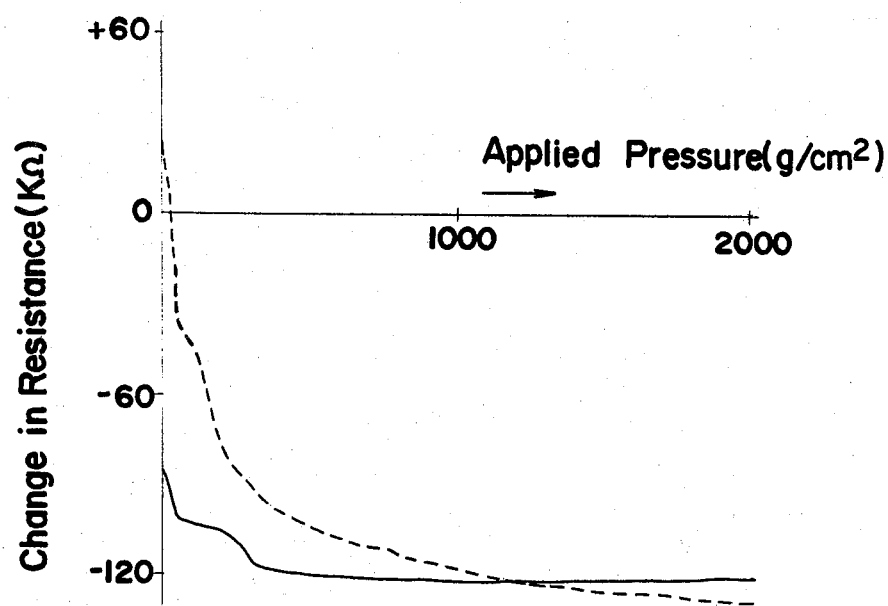
FIG. 10 is a graph showing the relationship between variation in applied pressure and the antiresonant resistance of the filter of the present invention.
Figure 11:
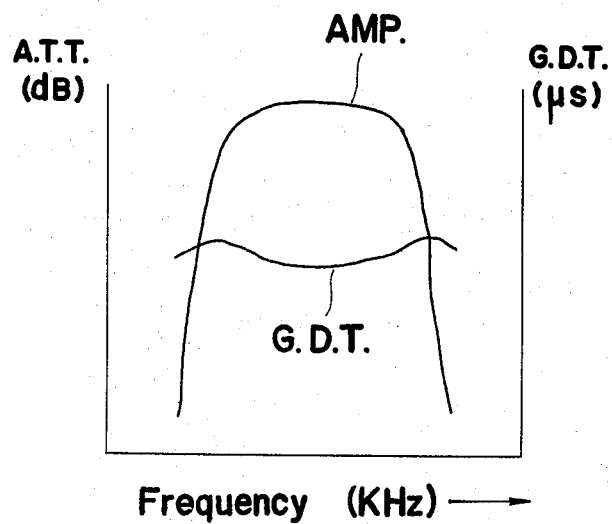
FIG. 11 is a graph showing the A.M.P. and G.D.T. characteristics of the filter of the present invention.

As this pressure increases beyond that used in the conventional design shown in FIG. 1, no substantial variation takes place in resonance or antiresonance frequency, but the resonant resistance increases and the antiresonant resistance decreases, with the mechanical quality factor Q consequently being lowered substantially. FIG. 5 shows the relationship between applied pressure and variation in band width for the filter of the invention. FIG. 6 shows the relationship between applied pressure and the insertion loss. FIG. 7 shows the relationship between applied pressure and resonance frequency. FIG. 8 shows the relationship between applied pressure and antiresonance frequency. FIG. 9 shows the relationship between applied pressure and resonant resistance. FIG. 10 shows the relationship between applied pressure and antiresonant resistance.

It is to be noted that, in the graphs shown in FIGS. 7 to 10, the solid line is obtained with the filter wherein each of the electroconductive pliable sheets 9 and 10 is of a circular shape while the broken line is obtained with the filter wherein each of the electroconductive pliable sheets 9 and 10 is of a square shape, both of the sheets 9 and 10 having, in either case, substantial electroconductivity only across their thickness.

As can readily be understood from the graphs of FIGS. 5 to 10, by suitably selecting the amount of pressure to be applied, a desired G.D.T. characteristic can readily be achieved. By way of example, as compared with the prior art filter having a mechanical quality factor of 1,000, the mechanical quality factor of the filter assembled according to the present invention and wherein the resonators I to V are compressed together by the application of the pressure has been found to be only about 100. FIG. 10 shows the selective filtering characteristic and the G.D.T. characteristic of the ladder-type filter according to the present invention.

It is to be noted that the electroconductive pliable sheets 9 and 10 may be of any desired shape, for example, square, circular, rectangular, hexagonal, octagonal or oval, and of any desired size. Furthermore, the electroconductive pliable sheets 9 and 10 may be of different shape and/or size. In addition, a resonator could have only one pliable sheet rather than two as shown, and in a ladder-type filter such as that shown in FIG. 4, at least one of the component resonators I to V may be provided with only one electroconductive pliable sheet.

According to the present invention, because of the provision of an electroconductive pliable sheet between the terminal plate and the corresponding face of the resonator, the following advantages can be gained. The G.D.T. characteristic can be improved even if a piezoelectric substrate of high mechanical quality factor is employed.

Moreover, the prior art ladder-type filter of the construction shown in FIG. 1 is susceptible to change in performance characteristic, particularly, at an attenuation level of −90 dB to −110 dB, when the filter itself receives an impact or is dropped. The prior art ladder-type filter is such that its performance curves at high and lower frequency components of the frequency at which maximum attenuation is attained exhibit a considerable fluctuation.

While the prior art ladder-type filter exhibits a maximum attenuation of −80 to −90 dB, the ladder-type filter of the present invention has in practice exhibited a maximum attenuation of about −120 dB with its performance curve exhibiting no fluctuation.

As regards the resistance to vibration and impact, while the prior art filter can withstand a vibration of 20 cycles per second, the present invention is such that its performance can be stabilized under vibration of up to at least 100 cycles per second. This means that the filter according to the present invention can withstand any possible vibration or impact which it may receive during ordinary handling and, therefore, even if the filter of the present invention is handled more roughly than the prior art filter, it will not generate shock noises. Furthermore, as compared with variation in level within the band width occurring from 0.5 to 1.0 dB in the prior art filter, the filter of the present invention has shown variation in level within the band width within the range of 0 to 0.2 dB.

In particular, in the prior art filter shown in FIG. 1, there is a direct contact of each protuberance to the electrode layer on the corresponding face of the piezoelectric substrate. Therefore, when an impact or vibration is applied to the prior art filter, the protuberance rubs the electrode to such an extent that the electrode is ultimately stripped off. The piezoelectric substrate used in the prior art filter is particularly susceptible to damage when a strong impact is applied to it. However, according to the present invention, this possibility is advantageously eliminated by the provision of the electroconductive pliable sheet.

Furthermore, the employment of the electroconductive pliable sheet enables the employment of a relatively thin piezoelectric substrate, which in turn permits the manufacture of a filter of a relatively small size. Since the conventional piezoelectric substrate of a high mechanical quality factor can be employed in the present invention, a conventional casing can be employed without causing any variation in attenuation level. Use of the conventional casing permits the manufacture of the filter of the present invention at reduced cost.

As compared with the conventional method of manufacturing the piezoelectric filter, the present invention requires only the extra step of providing the electroconductive pliable sheet. Even though the extra manufacturing step is required in the manufacture of the piezoelectric filter of the present invention, the method is believed to be simpler than the prior art method, as disclosed in the Japanese Laid-open Utility Model Publication No. 52-60278, laid open to public inspection in 1977. This last mentioned publication discloses the use of an electroconductive polymer compound as a material for the protuberance, which must be subsequently bonded to the associated terminal plate. This publication also discloses coating the electroconductive polymer compound on the metallic terminal element to develop an elastic and electroconductive connection between the piezoelectric substrate and the corresponding terminal element.

In the manufacture of the prior art filter of the construction shown in FIG. 1, care is required in positioning each terminal plate relative to the corresponding piezoelectric substrate so that the associated protuberance 4a is aligned with the node of vibration of the piezoelectric substrate. However, in the present invention, such care is not required and, therefore, the manufacture of the filter according to the present invention can be automated with high yield, and the manufacturing cost of the filter according to the present invention can be reduced.

It should be noted that the concept of the present invention is applicable not only to the ladder-type filter such as described above, but also to any other type of filter utilizing a piezoelectric resonator.

Although the present invention has fully been described in connection with a preferred embodiment thereof with reference to the accompanying drawings, many variations and modifications therefor will now be apparent to those skilled in the art, and the scope of the present invention is to be limited, not by the details of the preferred embodiment described herein, but only by the terms of the appended claims.

What is claimed is:

1. A piezoelectric filter including at least one piezoelectric resonator which comprises:
   a piezoelectric substrate having first and second opposing major faces;
   first and second electrode layers disposed on said first and second faces, respectively;
   first and second electroconductive terminal members in electrical contact with said first and second faces of said piezoelectric substrate, respectively;
   an electroconductive sheet disposed between and in mechanical and electrical contact with both said first terminal member and said first electrode layer; and means for applying pressure to said terminal members in a direction perpendicular to said first and second faces of said piezoelectric substrate, said pressure applying means applying pressure to said terminal members at a predetermined pressure level which will cause said filter to exhibit a desired G.D.T. characteristic.

2. A piezoelectric filter as claimed in claim 1, wherein said electroconductive pliable sheet is a total-conductive plastic sheet.

3. A piezoelectric filter as claimed in claim 1, wherein said electroconductive pliable sheet is an anisotropically electroconductive plastic sheet.

4. A piezoelectric filter as claimed in claim 1, wherein said electroconductive pliable sheet is a pressure-conductive plastic sheet.

* * * * *